United States Patent [19]

Shiratake et al.

[11] Patent Number: 5,537,347
[45] Date of Patent: Jul. 16, 1996

[54] DYNAMIC SEMICONDUCTOR MEMORY DEVICE

[75] Inventors: Shinichiro Shiratake, Tokyo; Daisaburo Takashima, Kanagawa-ken, both of Japan

[73] Assignee: Kabushiki Kaisha Toshiba, Kanagawa-ken, Japan

[21] Appl. No.: 297,957

[22] Filed: Aug. 31, 1994

[30]  Foreign Application Priority Data

Sep. 2, 1993  [JP]  Japan .................................. 5-218893

[51] Int. Cl.$^6$ ..................................................... G11C 7/00
[52] U.S. Cl. ........................... 365/149; 365/63; 365/190
[58] Field of Search ............................... 365/149, 189.01, 365/63, 190

[56]  References Cited

U.S. PATENT DOCUMENTS 5,341,326  8/1994  Takase et al. ........................... 365/149
5,369,612  11/1994  Furuyama ............................... 365/149

FOREIGN PATENT DOCUMENTS 567393  3/1993  Japan ..................................... 365/149

OTHER PUBLICATIONS

"A Block–Oriented RAM with Half–Sized DRAM Cell and Quasi–Folded Data–Line Architecture", Kimura et al., Digest of Technical Papers, ISSCC 91, pp. 106–107 & 297, Feb. 14, 1991.

"An Experimental DRAM with a NAND–Structured Cell", Hasegawa et al., Digest of Technical Papers, ISSCC 93, pp. 46–47, Feb. 24, 1993.

*Primary Examiner*—David C. Nelms
*Assistant Examiner*—Vu A. Le
*Attorney, Agent, or Firm*—Finnegan, Henderson, Farabow, Garrett & Dunner

[57]  ABSTRACT

A NAND-type dynamic semiconductor memory device having a folded bit architecture which reduces chip size and decreases array noise and soft error. The device is comprised of a plurality of memory cell groups, each group comprised of a plurality of bit memory cells connected in series, each bit memory cell having a MOS transistor and a capacitor. Two adjacent memory cell groups are connected respectively to one of a pair of bit lines. Each bit line is coupled respectively to a first one of the transistors located at the end of each memory cell group. A pair of first word lines are coupled respectively to the gates of the first one of the transistors coupled to the paired bit lines. A plurality of second word lines are each commonly coupled to the gates of corresponding ones of the transistors of the memory cell groups coupled to the paired bit lines.

13 Claims, 18 Drawing Sheets

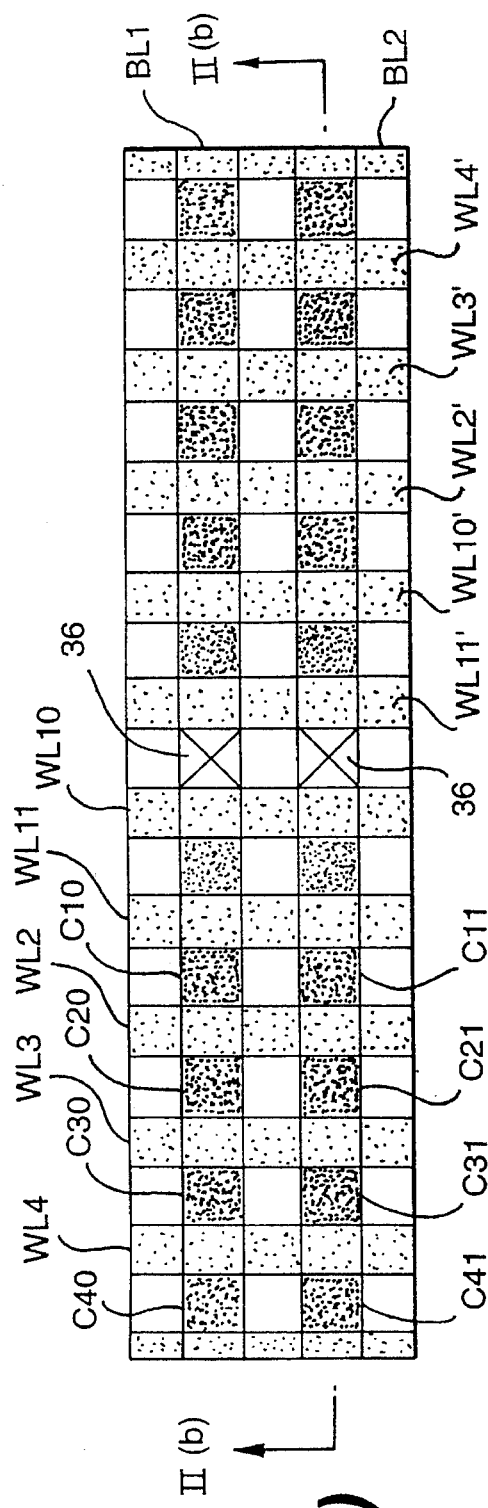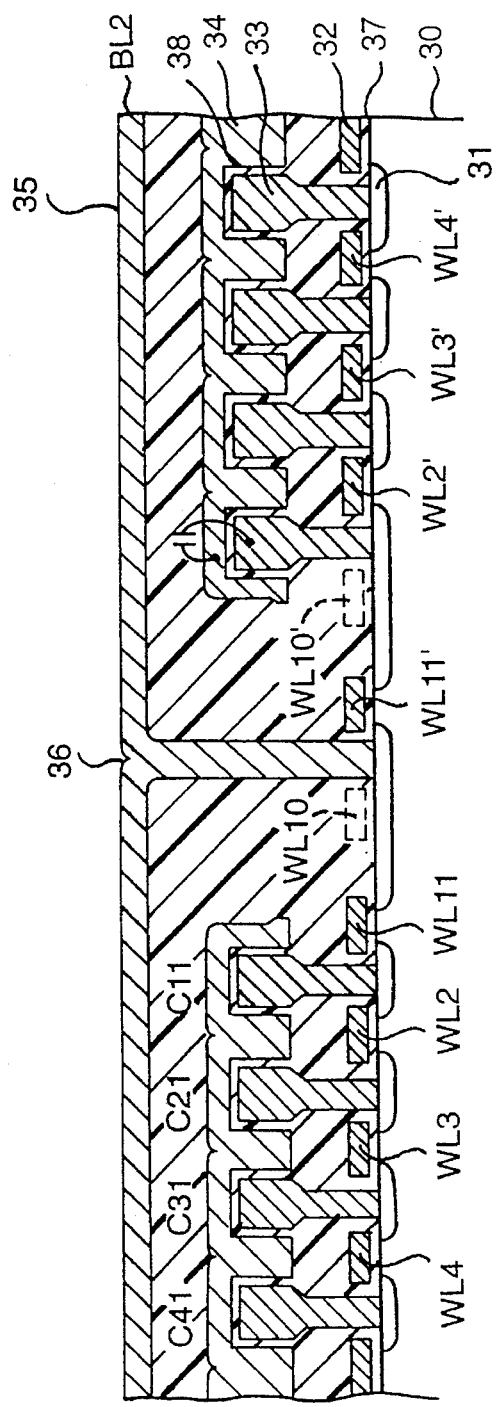

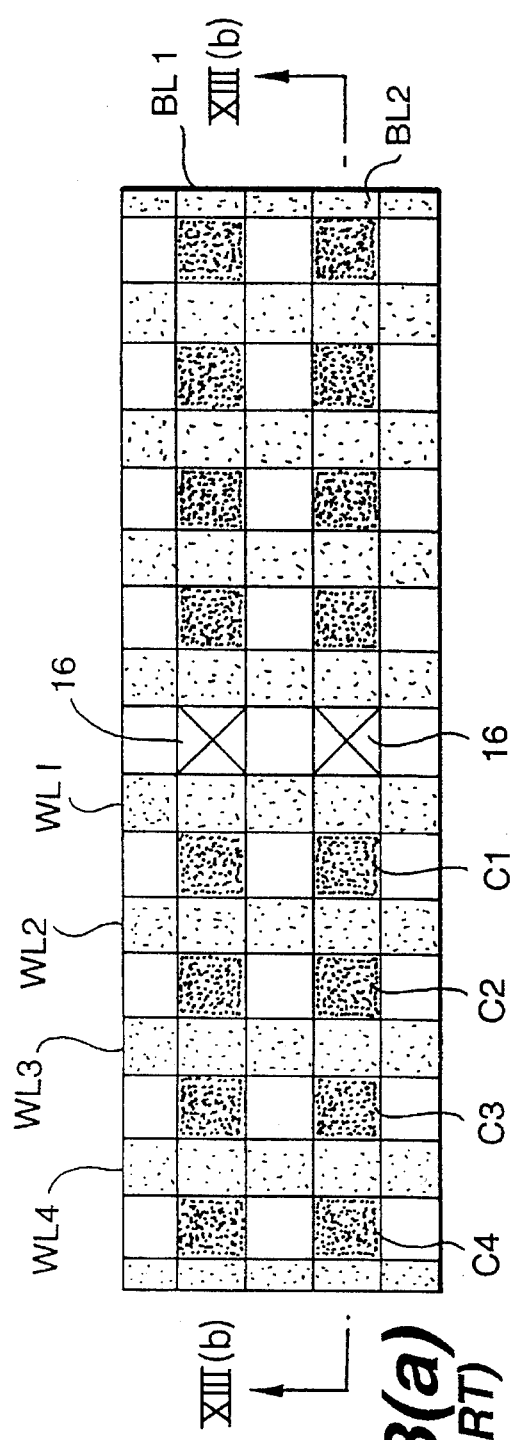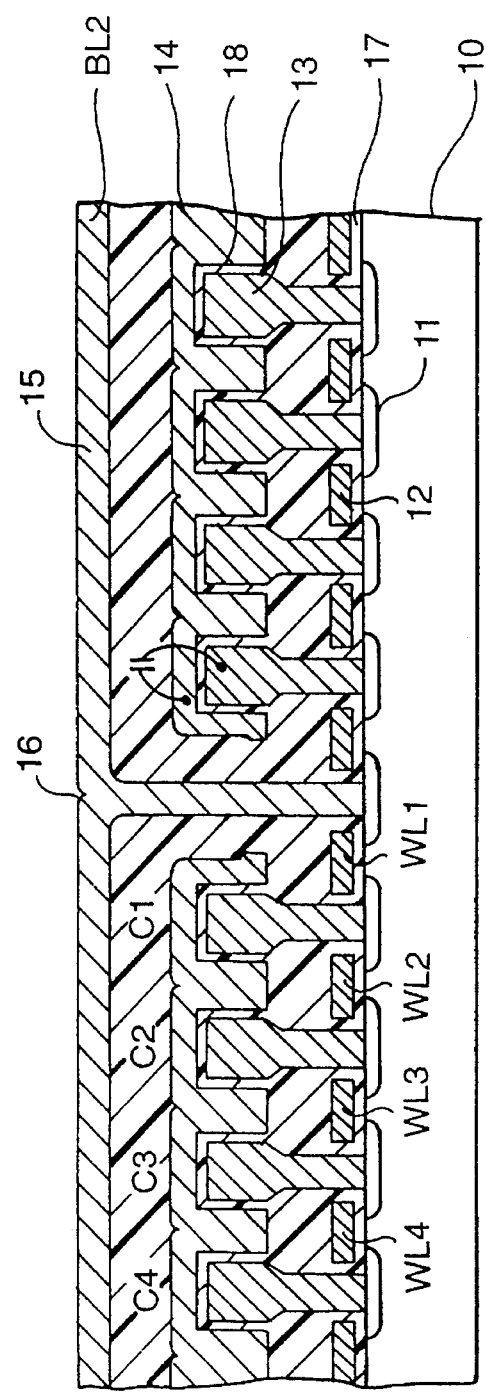
FIG. 13(a) (PRIOR ART)
FIG. 13(b) (PRIOR ART)

DYNAMIC SEMICONDUCTOR MEMORY DEVICE

BACKGROUND OF THE INVENTION

1. Field of the Invention

The present invention relates to a NAND type dynamic semiconductor random access memory (DRAM) having a unit with a memory-cell group having a plurality of memory cells connected in series. More particularly, the present invention relates to NAND type DRAM including a folded bit line architecture.

2. Description of the Related Art

A high integration density of dynamic random access memories DRAMS has been realized by microfabrication in process technology and device technology. However, microfabrication techniques appear to have reached limits in recent years. Nevertheless, a semiconductor memory unit, referred to as a NAND type DRAM, which included connected in series a plurality of DRAM cells each having 1 transistor/1 capacitor, was recently proposed (ISSCC Digest of technical paper pp. 46–47 (1993)).

In the NAND type DRAM, the large number of contacts to a bit line can be decreased, as compared with a conventional DRAM. For this reason, the area which a memory cell array occupies in a chip can be reduced to enable a high integration density. FIG. 12 shows a circuit diagram of a NAND type DRAM. FIG. 13(a) and FIG. 13(b) show a plan view and a sectional view of the NAND type DRAM, respectively.

A gate-electrode 12 which becomes a word line (WL) is formed on a Si substrate 10 through a gate insulation film 17. A source/drain diffusion layer 11 is formed in the substrate 10 to both sides of the gate electrode 12, and a MOS transistor is thereby formed. A storage node electrode 13 is connected to one of the source/drain diffusion layer 11 of the transistor.

A plate electrode 14 which confronts 13 the electrode 13 is formed over to form a capacitor,e.g., c1, c2, etc. through a capacitor insulation film 18. A one bit memory cell comprises the capacitor including electrodes 13, 14 and the transistor. Here, one of the source/drain diffusion layers 11 is shared with one of the source/drain layers 11 of an adjacent transistor.

In this example, a bit-line (BL) 15 is connected to the one of the source/drain diffusion layers 11 at the respective ends of adjacent four bit memory-cell groups at a bit line contact 16. Thus, a NAND type DRAM having as a unit memory cell groups with a plurality of memory cells connected in series is provided. For this reason, the memory cell can be made small.

In FIG. 12, a reading out/rewriting circuit 19 is connected to the bit lines BL and LBL to read out and rewrite information to the memory cell groups connected to the bit line.

In the illustrated NAND type DRAM, the memory cells exist at the crossing point of the word lines WL and the bit lines BL. The memory cell data is read to all bit lines that intersect the selected word line. For this reason, an open bit line architecture is provided in which a bit line connected to a memory cell array which is arranged at the opposite side of reading out/rewriting circuit 19 is used as a reference bit-line (/BL) and amplifying the potential between the bit line BL and/BL is employed for reading/rewriting.

The open bit line architecture has a disadvantage that the system is very susceptible to noise and soft error in the memory cell array as compared with a folded bit-line architecture which is conventionally used for other DRAM configurations.

FIG. 14 illustrates capacitive coupling between adjacent memory cells and bit lines in a NAND type DRAM.

As shown in FIG. 14, each of bit lines BL0, BL1, and BL2 can receive a coupling noise by the coupling capacitance CBB between adjacent bit lines, when data is read out from a memory cell. Furthermore, the signal read out as the memory cell data causes the potential of the word line WL to change, via the capacitance CWB between crossing bit lines and word lines. This potential change feeds back again and is applied to the bit line BL as another noise. Similarly, the bit line BL receives similar noises through the electrode of a plate or the substrate, etc.

In the open bit line architecture, data is not read out to the reference bit-line, and therefore the above noises are not coupled to the reference bit-line. Accordingly, all noise that occur on a bit line become bit line noise, and the read-out of data cannot be made accurately. Similarly, the open bit line architecture has a disadvantage that soft errors caused by alpha ray which impinge on the BL contact also occur only on one side of a pair of bit lines.

Thus, in the conventional NAND type DRAM, the open bit-line architecture is employed in which data is read to all bit lines connected with the selected word line and the cell array is arranged at one side of the reading out/rewriting circuit 19.

Therefore, a DRAM chip size can be reduced.

However, there is a problem that a NAND type DRAM having a high reliability cannot be realized because of the noises or the soft error experienced in the memory cell array.

SUMMARY OF THE INVENTION

The present invention is made in consideration of the abovementioned situation. It is an object of the present invention to provide a NAND type DRAM which overcomes the above described problems and disadvantages of the conventional NAND type DRAM. It is another object of the present invention is to provide DRAM having a series of connected memory cells which enable a reduction of chip size and can reduce array noise and soft error.

In view of the above objects and in accordance with the present invention, there is provided a dynamic random access memory which comprises: a first and second memory group, each of the first and second groups including a plurality of memory cells electrically coupled in series, each of the memory cells comprising an insulated gate type MOS transistor and a capacitor coupled to the MOS transistor; a first and a second bit line connected to one end of the first and second memory cell groups, respectively; a plurality of word lines, commonly coupled to the gates of corresponding ones of the MOS transistors of the first and second memory cell groups, respectively; and means for reading out from the first and second memory cell groups data from the memory cells of the first and second memory cell groups with the first and second bit lines each providing a voltage reference during reading of data from the memory cells of the second and first cell groups, respectively. Further in accordance with the present invention, there is provided a dynamic semiconductor memory device including a plurality of memory cell units, each unit having a plurality of insulated gate type transistors coupled in series and a plurality of capacitor portions for storing data, each capacitor portion coupled to one of the transistors, respectively. The memory device comprises: a plurality of bit lines, each coupled to a first one of the transistors at one end of the series coupled transistors of one of the memory cell units, respectively, and paired with another one of the plurality of bit lines; a pair of first word lines respectively coupled to the gates of the first transistors of the memory cell units coupled to the paired bit lines; and second word lines each coupled to the gates of corresponding ones of the transistors of the memory cell units coupled to the paired bit lines.

Also in accordance with the present invention, there is provided a dynamic semiconductor memory device including first, second, third, and fourth memory cell units each having insulated gate type transistor coupled in series and capacitors for storing data, each capacitor coupled to one of the transistors, respectively. The memory device comprises: a first bit line coupled to a first one of the transistors at one end of the series coupled transistors of the first and second memory cell units, respectively, and a second bit line coupled to a first one of the transistors at one end of the series coupled transistors of the third and fourth memory cell units, respectively; first word lines each coupled to the respective gates of corresponding ones of the transistors of the first and third cell units for selecting specified capacitors, and second word lines each coupled to the respective gates of corresponding ones of the transistors of the second and fourth cell units for selecting specified capacitors; a first transfer gate transistor having first and second terminals respectively coupled to the first transistors of the first and second memory cell units, the first terminal of the first transfer gate transistor also coupled to the first bit line; and the second transfer gate transistor having first and second terminals respectively coupled to the first transistors of the third and fourth memory cell units, the second termimal of the second transfer gate transistor also coupled to the first bit line.

BRIEF DESCRIPTION OF THE DRAWINGS

FIG. 2(a) and FIG. 2(b) are a plan view and a sectional view of the 1st embodiment, according to the present invention, respectively.

FIG. 13(a) and FIG. 13(b) are a plan view and a sectional view of the conventional DRAM, respectively.

DETAILED DESCRIPTION OF THE PREFERRED EMBODIMENTS

Figure 1:
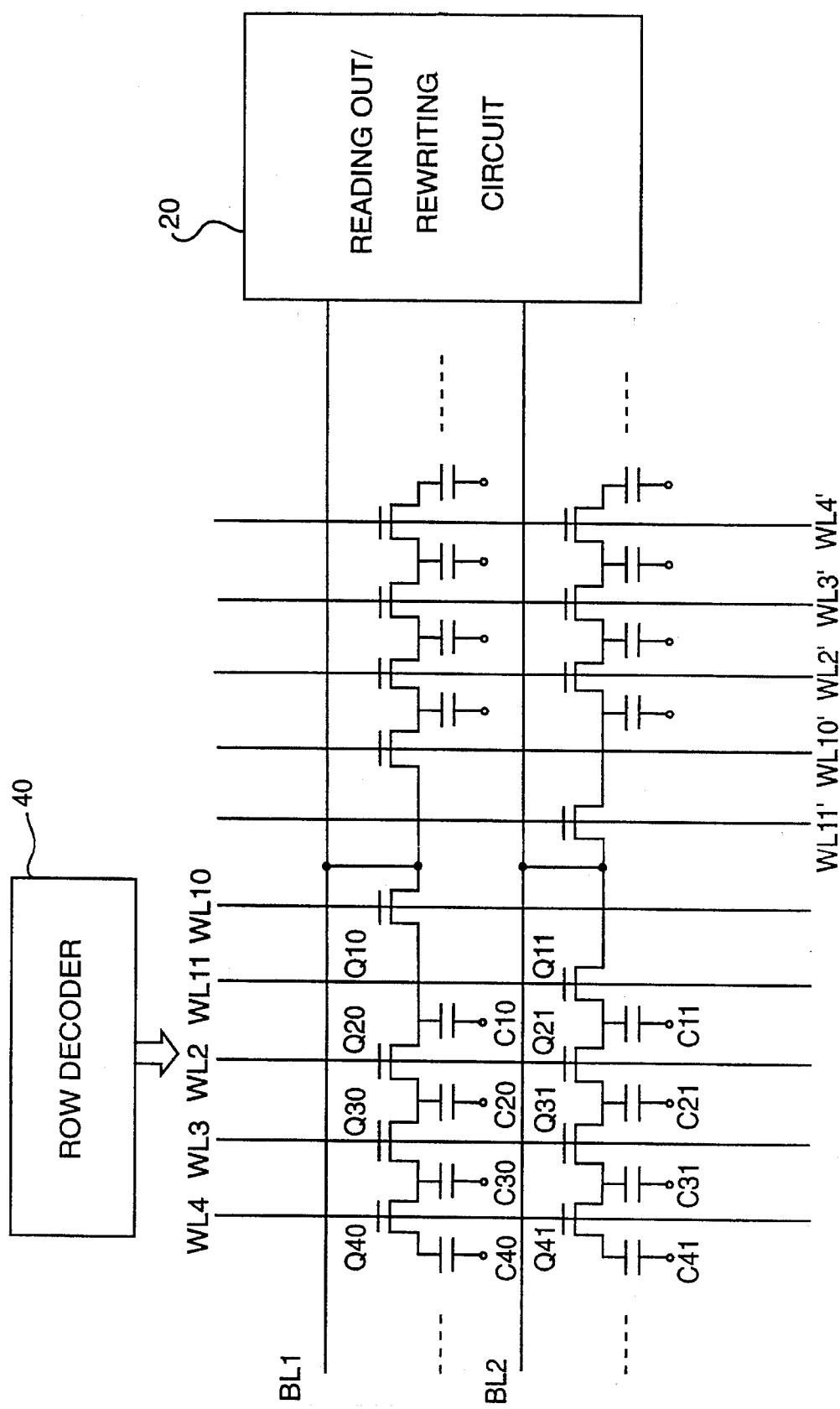
FIG. 1 is a circuit diagram showing a NAND type DRAM of a 1st embodiment, according to the present invention.

FIG. 1 shows a circuit diagram of a NAND type DRAM of a 1st embodiment of this invention.

FIG. 2(a) shows a plan view of a layout of the DRAM of the 1st embodiment and FIG. 2(b) shows a sectional view of the DRAM in the direction of the arrow II(b)—II(b) in FIG. 2(a).

As shown in FIG. 1, FIG. 2(a) and FIG. 2(b), a NAND cell unit (memory-cell group) has a plurality of transfer gates connected in series and a memory cell capacitor connected to each transfer gate. One end of the NAND cell unit is connected to a bit line BL. For example, a first NAND cell consists of MOS transistors Q10, Q20, Q30, and Q40 and respectively associated capacitors C10, C20, C30, and C40, and is connected to bit line BL1. A second NAND cell consists of transistors Q11, Q21, Q31, and Q41 and respectively associated capacitors C11, C21, C31 and C41, and is connected to bit line BL2. For the purpose of describing the 1st embodiment, the first and second NAND cells are also referred to as a pair of NAND cells.

While it is preferred herein to provide four transistors and associated capacitors in each NAND cell, the invention can be effectively practiced with a larger or smaller number of transistors and associated capacitors in each NAND cell. It is also not required that each NAND cell include the same number of transistros and associated capacitors.

Two NAND cells are respectively connected with one bit line BL. Bit lines BL1 and BL2 are connected to a reading out/re-writing circuit 20 including a sense amplifier and means for temporally storing data. The two bit lines comprise a folded bit-line architecture as a pair of bit lines. Word lines WL2, WL3, and WL4 constitute common gate electrodes common to corresponding transistors of the first and second NAND cells which are connected to the pair of bit lines.

In the first embodiment, a gate electrode of the MOS transistor which is located at the end of the memory cell unit nearest a bit line contact is connected to an uncommon word line, i.e., to a word line not connected to any transistor of the other cell of the pair of NAND cells. That is, word line WL10 is connected to transistor Q10, but is not connected to any transistor of the second NAND cell. Word line WL11 is connected to transistor Q11 of the second NAND cell but is not connected to any transistor of the first NAND cell.

A structure of the NAND cell unit is further illustrated in FIG. 2(a) and FIG. 2(b). As shown in FIG. 2(b), a gate-electrode 32 which becomes a word line is formed on a Si substrate 30 through a gate insulation film 37.

A source/drain diffusion layer 31 is formed in the substrate 30 to the both sides of the gate electrode 32. A storage node electrode 33 is connected to one of the source/drain diffusion layers 31.

A plate electrode 34 which confronts the electrode 33 is formed over a capacitor insulation film 38 to form a capacitor.

One of the source/drain diffusion layers 31 is shared with one of the source/drain layers 31 of an adjacent transistor.

Bit-line (BL) 35 is connected at the bit line contact 36 to the source/drain diffusion layer 31 of one end of adjacent memory-cell groups. A row decoder 40 generates signals for selecting ones of the word lines.

In accordance with this construction, the memory cell data in each NAND cell is read out by selecting word lines WL2, WL3, and WL4 in turn beginning with the memory cell nearest to the bit line contact.

In reading, the memory cell data can be selectively read out to one of bit lines BL1 and BL2 by selecting only one of word lines WL10 and WL11, and thereafter selecting another word line.

When the memory cell data is read out to one of the bit lines, another bit line may serve as a reference bit-line for circuit 20.

Thus, a folded bit-line architecture is used in the 1st embodiment.

Figure 3A:
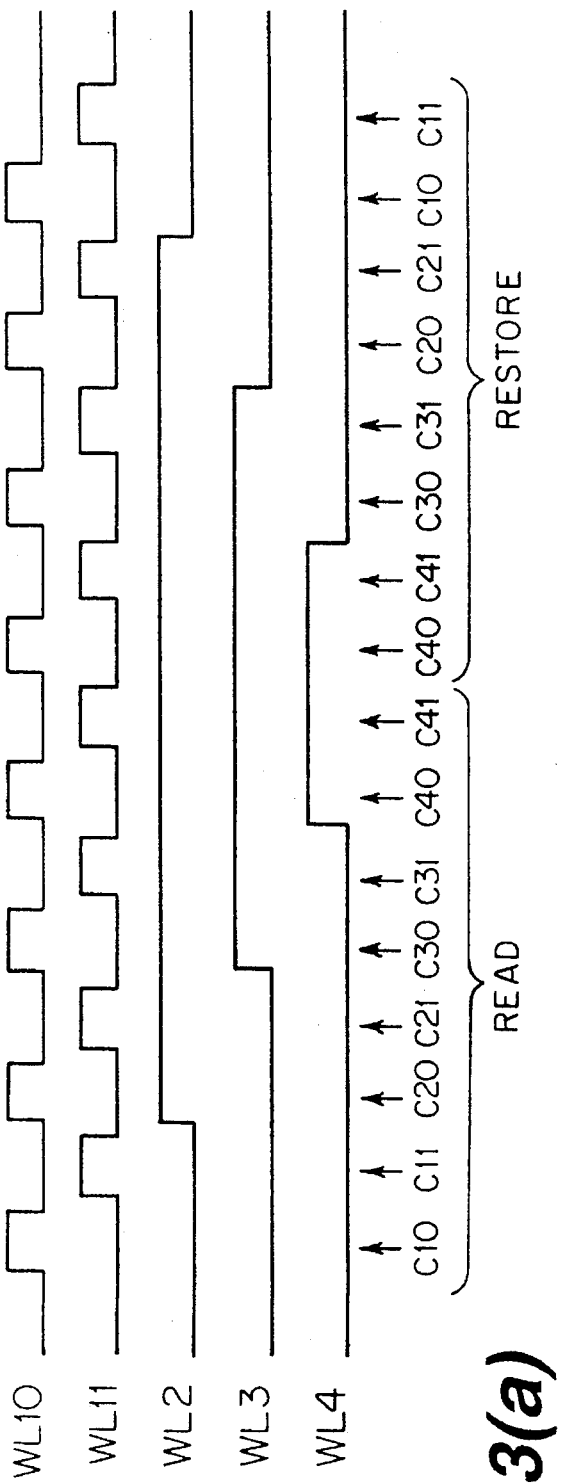
FIGS. 3(a) and 3(b) are operating waveform charts of the 1st embodiment.

The operation of the 1st embodiment is described in detail with reference to FIGS. 3(a) and 3(b). When the word lines WL are selected with a timing as shown in FIG. 3(a), the data of the capacitor C10 is read out to the bit line BL1 by setting WL10 to "H" and setting the other word lines to "L". Here, a folded bit-line architecture is employed by reading the potential difference between BL1 and the reference BL2 and amplifying this potential difference with the sense amplifier of the read/re-write circuit 20.

Next, after equalizing BL1 and BL2, the cell data of C11 is read out to BL2 by setting WL11 to "H" and other word lines to "L".

Moreover, the data of capacitor C20 is read out to BL1 by setting WL2 to "H", WL10 to "H", and other word lines to "L" after equalizing BL1 and BL2.

Similarly, next, the data of capacitor C21 is read out to BL2.

By executing the selection of word lines in accordance with the timing of FIG. 3(a), the data of the rest of the memory cells can be read out similarly.

As shown in FIG. 3(a), the re-write or restoration of a memory cell data is performed in the reverse sequence to the above described read out sequence. That is, the restoration is sequentially carried out beginning from the memory cell furthest from the bit line contact 16 to the nearest memory cell. In this embodiment, the data of two NAND cells are restored in the order of C40, C41, C30, C31, C20, C21, C10, and C11.

Figure 3B:
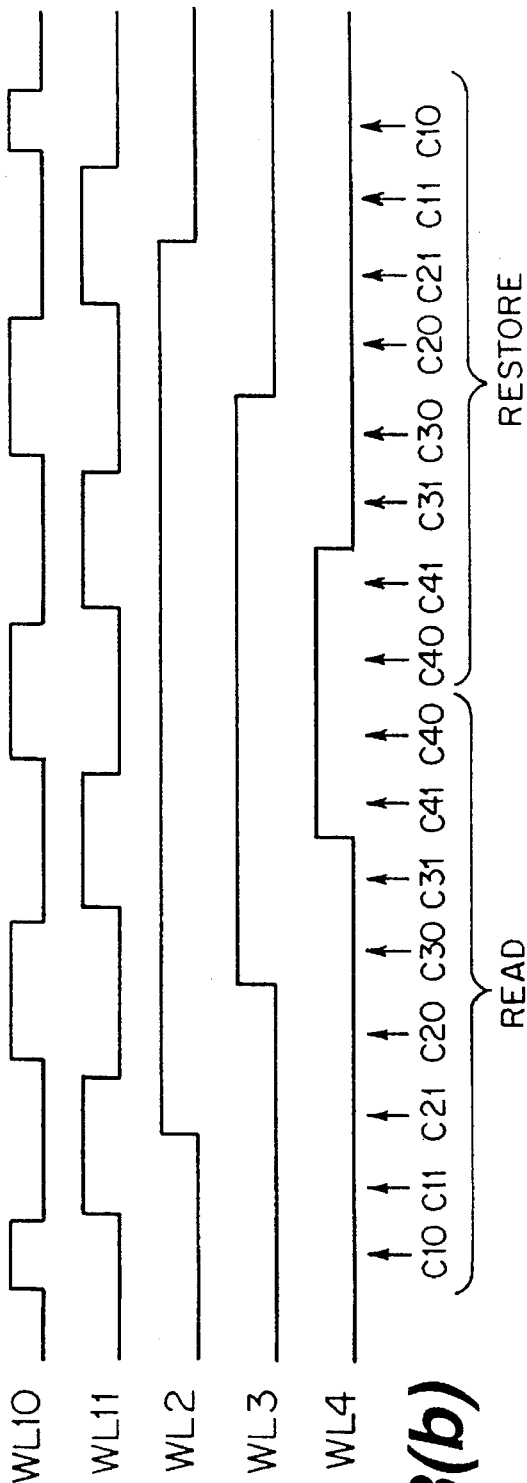

FIG. 3(b) shows an alternate timing which can be used to reduce the number of transitions between "H" and "L" of WL10 and WL11. After the read out of capacitor C10, the data of C11 is read out to BL2 by setting WL11 to "H" and the other word lines to "L". Bit lines BL1 and BL2 are equalized after reading the data of C11 to BL2. Then, the data of C21 is read out to BL2 by raising WL2 to "H", while WL11 remains "H".

The number of transitions to "H" and "L" of the word lines can be reduced by reading data twice in sequence to the same bit line in turn of BL1, BL2, BL1, BL2, and BL1.

In accordance with the alternate timing shown in FIG. 3(b) as well as the above described timing of FIG. 3(a), the restoration is sequentially carried out beginning from the memory cell furthest from the bit line contact.

In accordance with the alternate timing of FIG. 3(b), however, as in the data read-out, in order to reduce the number of transitions of the word lines, the restoration of data is transmitted twice in sequence to the same bit line. That is, the data of C40, C41, C31, C30, C20, C21, C11, and C10 are restored to each memory cell in this order.

Thus, the 1st embodiment of this invention is characterized by dividing the timing of the selection for two NAND cells which are connected with the pair of bit lines BL1 and BL2, and reading the data of each memory cell as shown in FIG. 3(a) or FIG. 3(b).

That is, when memory cell data is read out to the first of the pair of bit lines first, the second of the pair of bit lines is used as a reference bit-line. Subsequently when a memory cell data is read out ot the second of the pair of bit lines, the first of the pair of bit lines is used as a reference bit-line.

This folded bit-line architecture provides an effective reduction of the array noise in the memory cell, as compared with an open bit line architecture. For example, the array noise caused by the coupling between bit lines BL, and word-lines WL, a plate and a substrate is changed by the coupling of these nodes and bit lines BL.

In this embodiment, even when this change feeds back to the bit line BL by capacitive coupling, since pairs of bit lines BL1 and BL2 are in the same array, these bit lines receive the noise as a common mode. That is, since the potential difference between the pair of bit line BL1 and BL2 is amplified with the sense amplifier of circuit 20, this common mode noise can be substantially reduced. The coupling noise of bit lines is also reduced, as compared with the open bit line architecture, and various noise reduction schemes as applied in the conventional folded bit-line architecture can be practiced in the DRAM of the present invention.

Also with respect to the folded bit-line architecture of the present invention, the pair of bit lines BL1 and BL2 is similarly influenced by alpha rays which hit the diffusion layer 11 at the bit line contact 36. For this reason, the soft error resistance can be also improved, according to the embodiment. Moreover, since the composition of a folded bit-line architecture can be applied to a sense-amplifier arrangement, a pitch of sense-amplifier can be eased briefly, compared with an open bit line architecture.

In the 1st embodiment, only the transistors Q10 and Q11 which are arranged nearest to the bit line contact 36 are connected to different word lines. For this reason, there is an advantage that the increase of area for implementing the folded bit-line architecture can be made relatively small. That is, if a pair of NAND cells connected with a pair of bit lines are such cells that all transfer gates are commonly connected to corresponding word lines, the data of the pair of NAND cells may be read independently to bit lines BL1 and BL2. Therefore, two additional selective gates connected to different word lines are needed to each NAND cell.

In this case, the extra area provided for two word lines is needed for the two NAND cells. On the other hand, in this embodiment, since the area is provided for one word line to accommodate two NAND cells, the increase of area is reduced by one-half, as compared with the above example.

Figure 4:
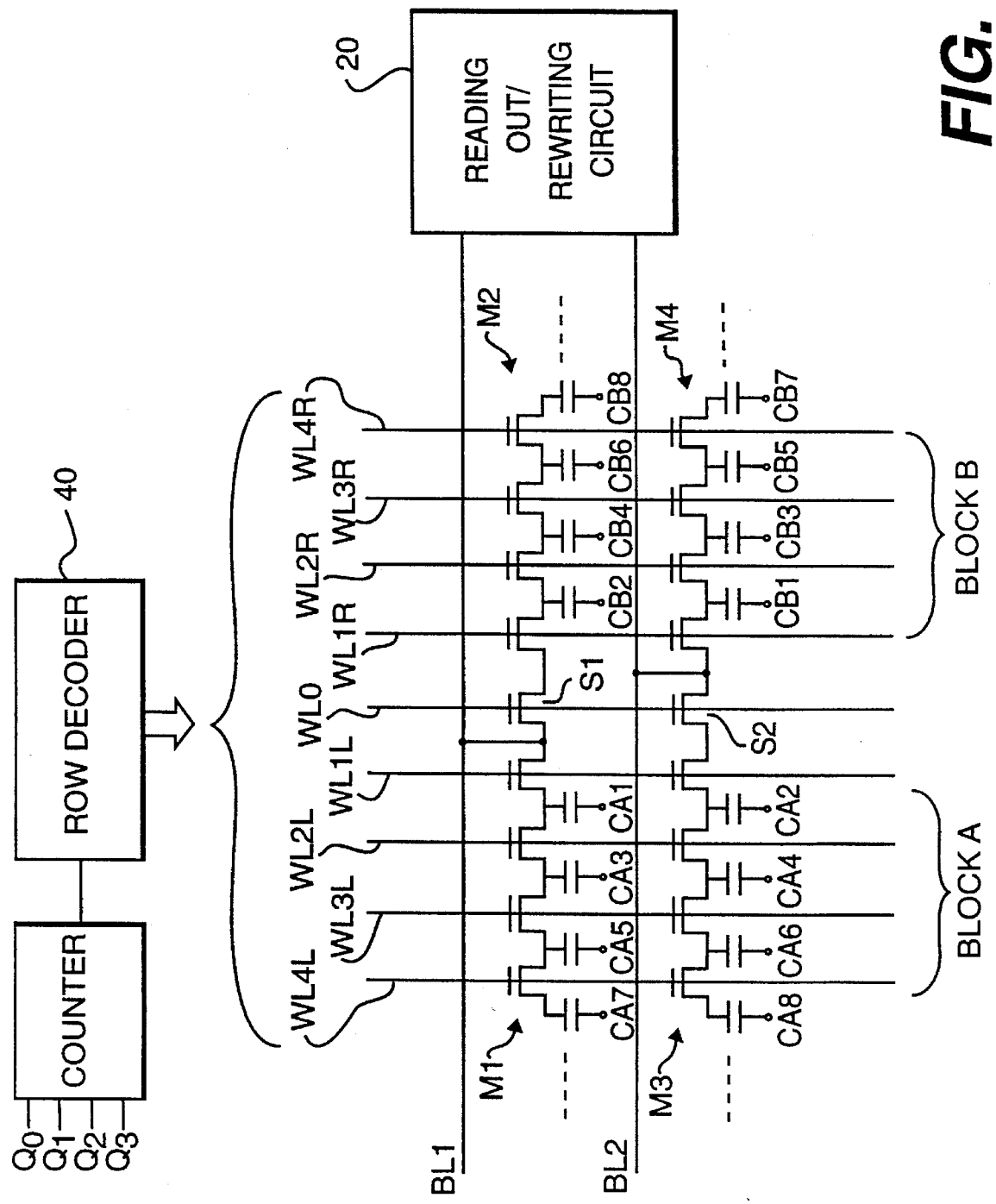
FIG. 4 is a circuit diagram showing a NAND type DRAM of a 2nd embodiment, according to the present invention.
Figure 5A:
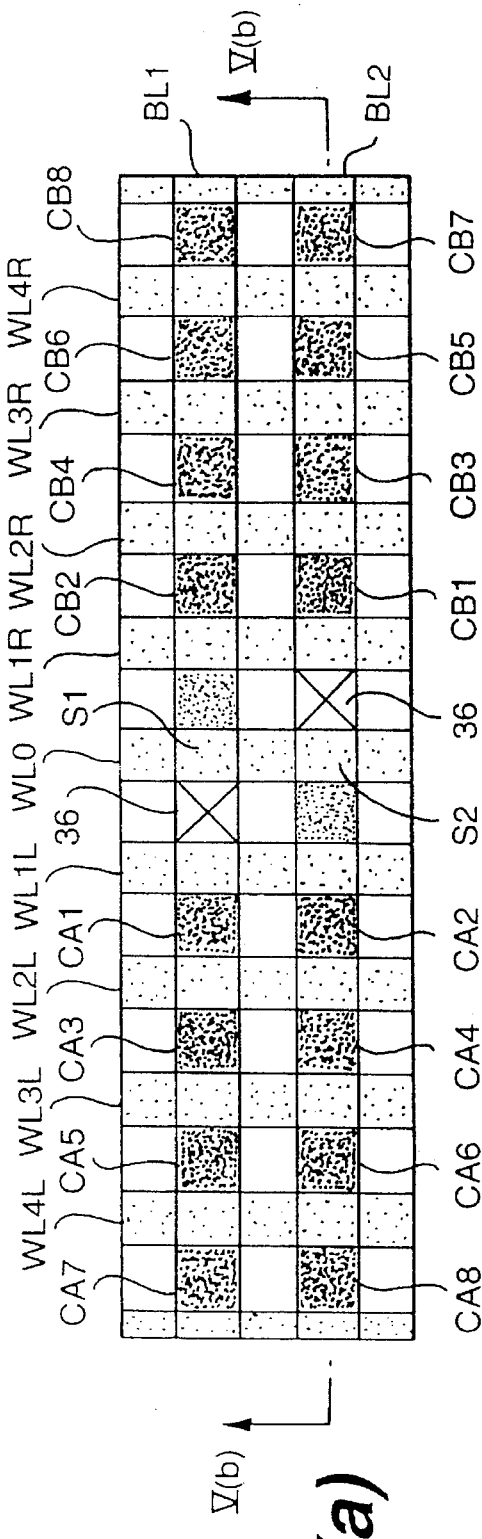
FIG. 5(a) and FIG. 5(b) are a plan view and a sectional view of the 2nd embodiment, according to the present invention.
Figure 5B:
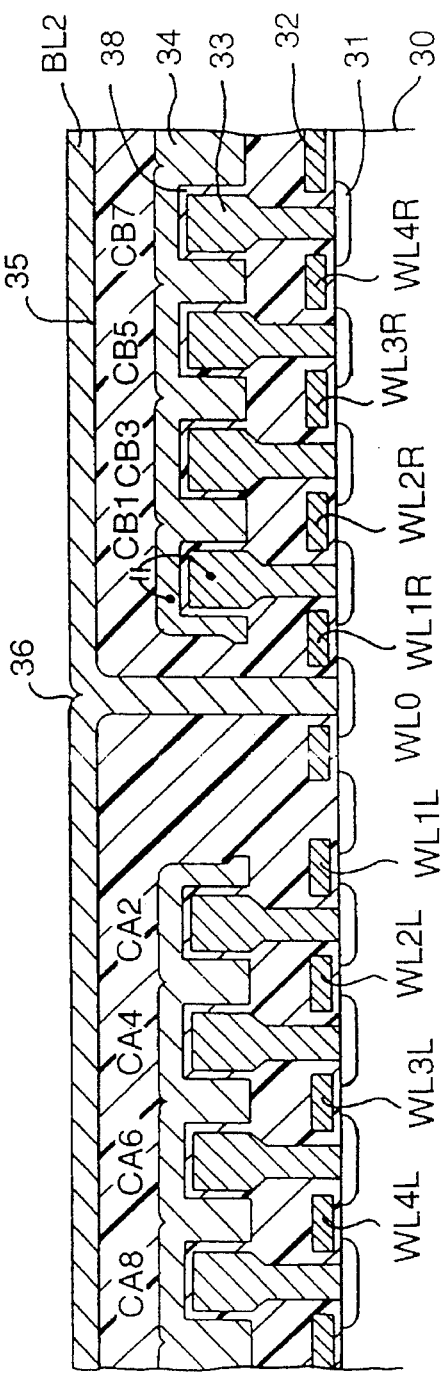

FIG. 4 shows a circuit diagram of a NAND type DRAM of a 2nd embodiment of this invention. FIG. 5(a) show a plan view of a layout of the DRAM of the 2nd embodiment and FIG. 5(b) shows a sectional view of the DRAM in the direction of the arrow V(b)—V(b) in FIG. 5(a). Reference numerals which are the same as used in connection with the first embodiment identify the same elements in the second embodiment.

Selective gate transistors or transfer gate transistors S1 and S2 connected with a common word line WL0 are formed so as to connect NAND cell units to one of two bit lines BL1 and BL2 which constitute a pair of bit lines.

NAND cell M1 is connected to a source of the selective gate transistor S1 and NAND cell M2 is connected to a drain of the selective gate transistor S1. NAND cell M3 which shares word lines WL (WL1L–WL4L) with NAND cell M1 is connected to a source of the selective gate transistor S2. NAND cell M4 which shares word lines WL (WL1R–WL4R) with NAND cell M2 is connected to a drain of the selective gate transistor S2. The source of the transfer gate transistor S1 is also connected to the first bit line BL1 and the drain of the transfer gate transistor S2 is also connected to the second bit line BL2. Further, bit line BL1 and BL2 are connected to the read/re-write circuit 20 which includes a sense amplifier and means for temporarily storing data, as in the first embodiment.

In addition, CA1, CA3, CA5 and CA7 in the figures are the memory cell capacitors of NAND cell M1; CA2, CA4, CA6, and CA8 are the capacitors of NAND cell M'; CB2, CB4, CB6, and CB8 are the capacitors of NAND cell M2'; and CB1, CB3, CB5, and CB7 are the capacitors of NAND cell M4'. NAND cells M1 and M3 are designated block A and cells M2 and M4 are designated block B.

As illustrated in FIG. 4, 5(a), and 5(b) the NAND type DRAM of the second embodiment differs from the first embodiment by provision of a transfer gate transistor between respective NAND cells coupled to the same bit line. Also, each of the four word lines, e.g., WL1L–WL4L for reading cells is connected to two transfer gate transistors.

In contrast, in the first embodiment, each of word lines WL10 and WL11 are connected to only one transfer gate transistors.

Figure 6:
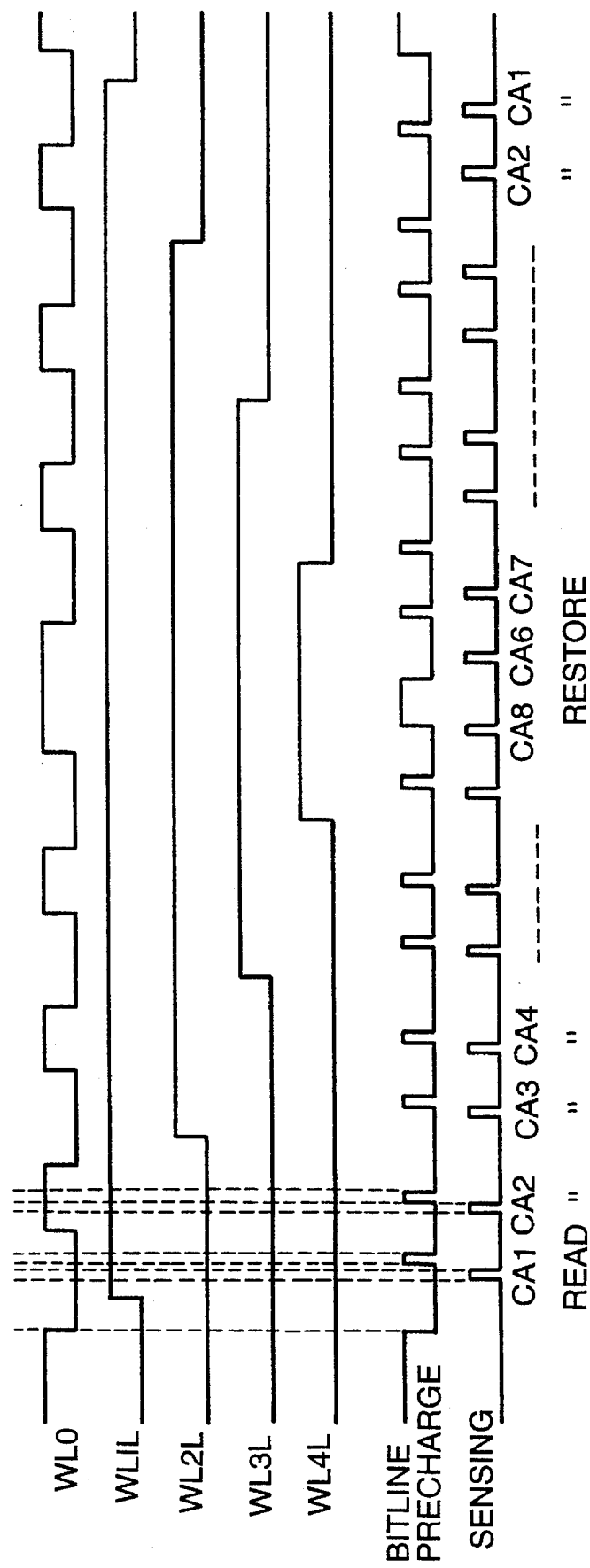
FIG. 6 is an operating waveform chart of the 2nd embodiment.

FIG. 6 shows an operating form wave chart for the circuit of the 2nd embodiment and illustrates the case in which the data of memory cells in block a of FIG. 4 are accessed. During data readout from these memory cells in block A, all of the word lines WL1R, WL2R, WL3R and WL4R in block B are set to "L". Conversely, when reading data in block B, all word lines of block A are set to "L".

In this embodiment, WL0 is set to "L", WL1L is set to "H", the other word lines are set to "L", and thereby the cell data of CA1 is read out to the bit line BL1. Next, WL0 is changed to the "H" state and the cell data of CA2 is read out to BL2.

Data is amplified with the sense amplifier of the read/re-write circuit 20. Subsequently, WL0 is set to "L", WL2L is set to "H", and the cell data of CA3 is read out to BL1. Next, when WL0 is set to the "H" state, the cell data of CA4 is read out to BL1 and BL2. When reading the data to one bit line BL, the other bit line BL can be used as a reference bit-line. Thus, a folded bit-line architecture can be employed. According to the second embodiment, reading out and writing of the data stored in the NAND cell cell can be performed with the folded bit-line architecture and the same effect as realized in the first embodiment can be obtained.

Figure 15:
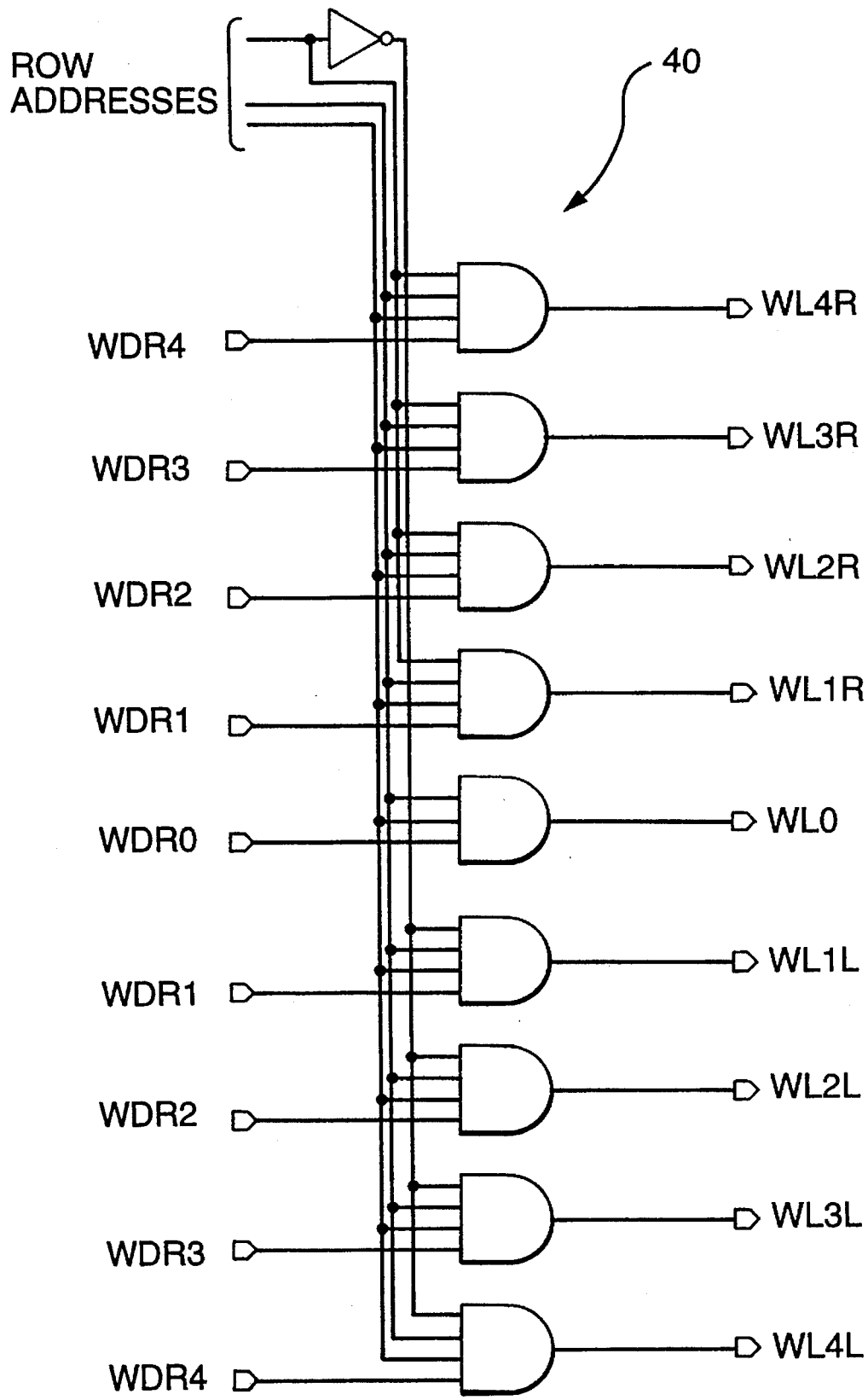
FIG. 15 is a row decoder circuit diagram employed in the embodiments according to the present invention.

Moreover, in the second embodiment, the area for one word-line per two blocks of memory cells is reduced as compared with the structure of the first embodiment shown FIG. 1. Thereby, the increase of extra area can be reduced to one half of the first embodiment. FIG. 15 shows a row decoder circuit 40 which controls the word lines WL0 to WL4L as shown in FIG. 6. The word lines WL4R to WL4L are controlled by driver signals WDR0 to WDR4.

In this embodiment, the word line WL0 is commonly used for the selective gate transistors S1 and S2. Therefore, the addresses of NAND cells, situated on opposite sides of the bit line contact, are different by one bit.

Word line driver signals WDR1 to WDR4 are common for the word lines of memory cells in block A and block B. The signals WDR1 to WDR4, applied to the row decoder circuit 40, are generated from a flip-flop circuit 60,61,62,63,64 shown in FIG. 17. The signals applied to the flip-flop circuit 60–64 are generated by counters of a counter circuit 80 shown in FIG. 16.

Figure 18:
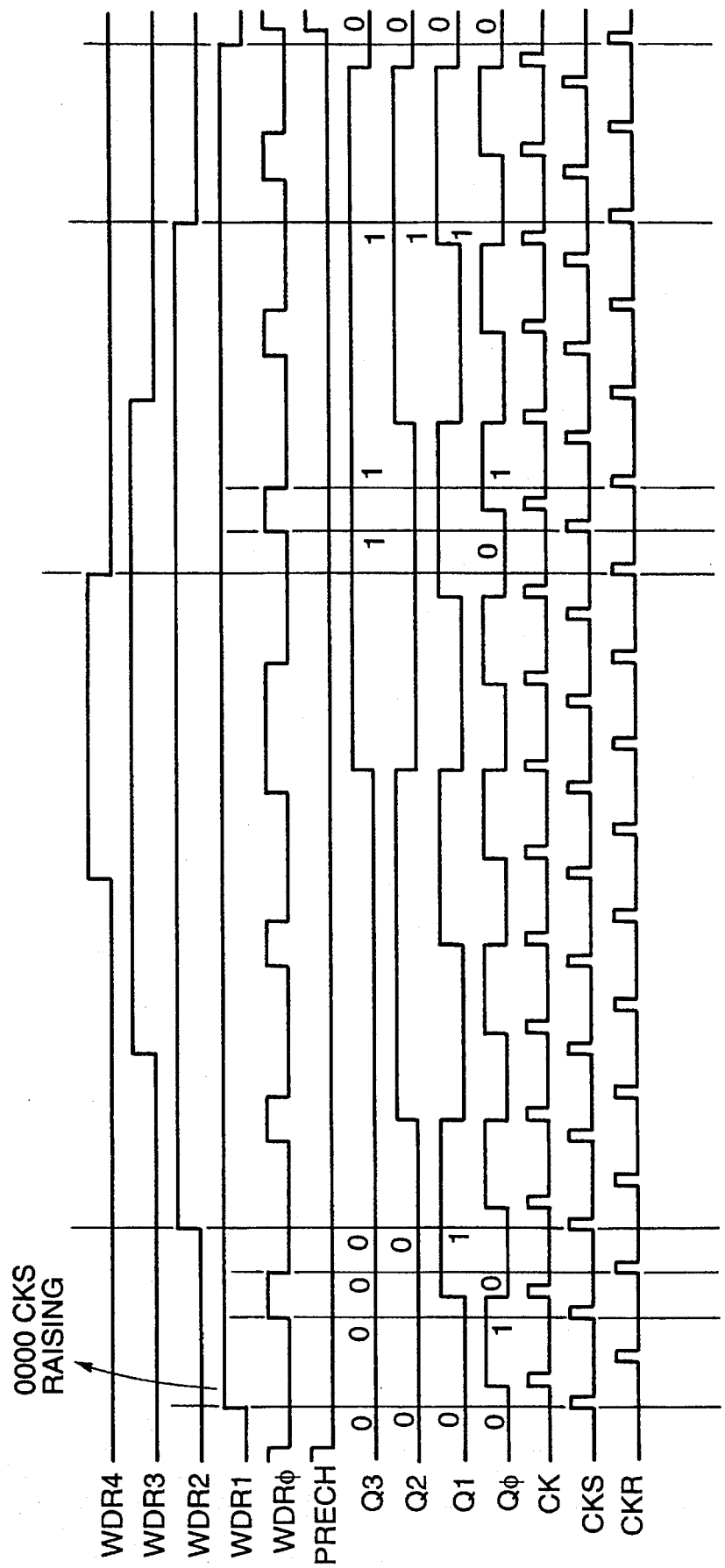
FIG. 18 is another operating waveform chart of the 2nd embodiment.

FIG. 18 illustrates the timing of the various control signals related to the operating of raw decoder circuit 40, flip-flop circuit 60–64 and counter circuit 80. In the flip-flop circuit 60–64, clock signals CKS and CKR, which have the same period as clock CK for increment the counters of counter circuit 80 are used. That is, of raising to "H" of WDRm(m=0 to 4) corresponding to the counter output corresponds to a timing of raising of clock CKS. A timing of lowering to "L" of WDRm corresponds to a timing of lowering of CKR.

Figure 16:
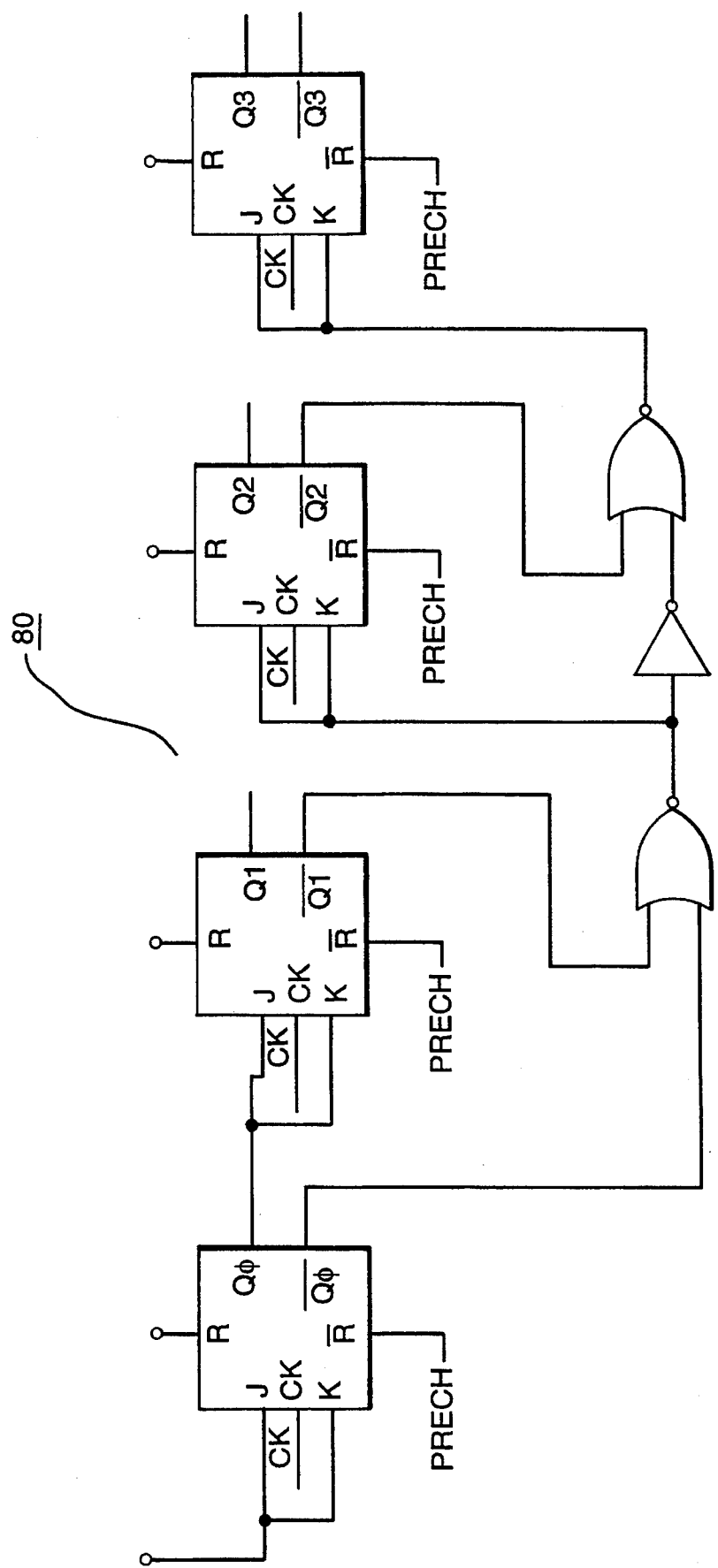
FIG. 16 is a circuit diagram for explaining the row decoder circuit in FIG. 15.
Figure 17:
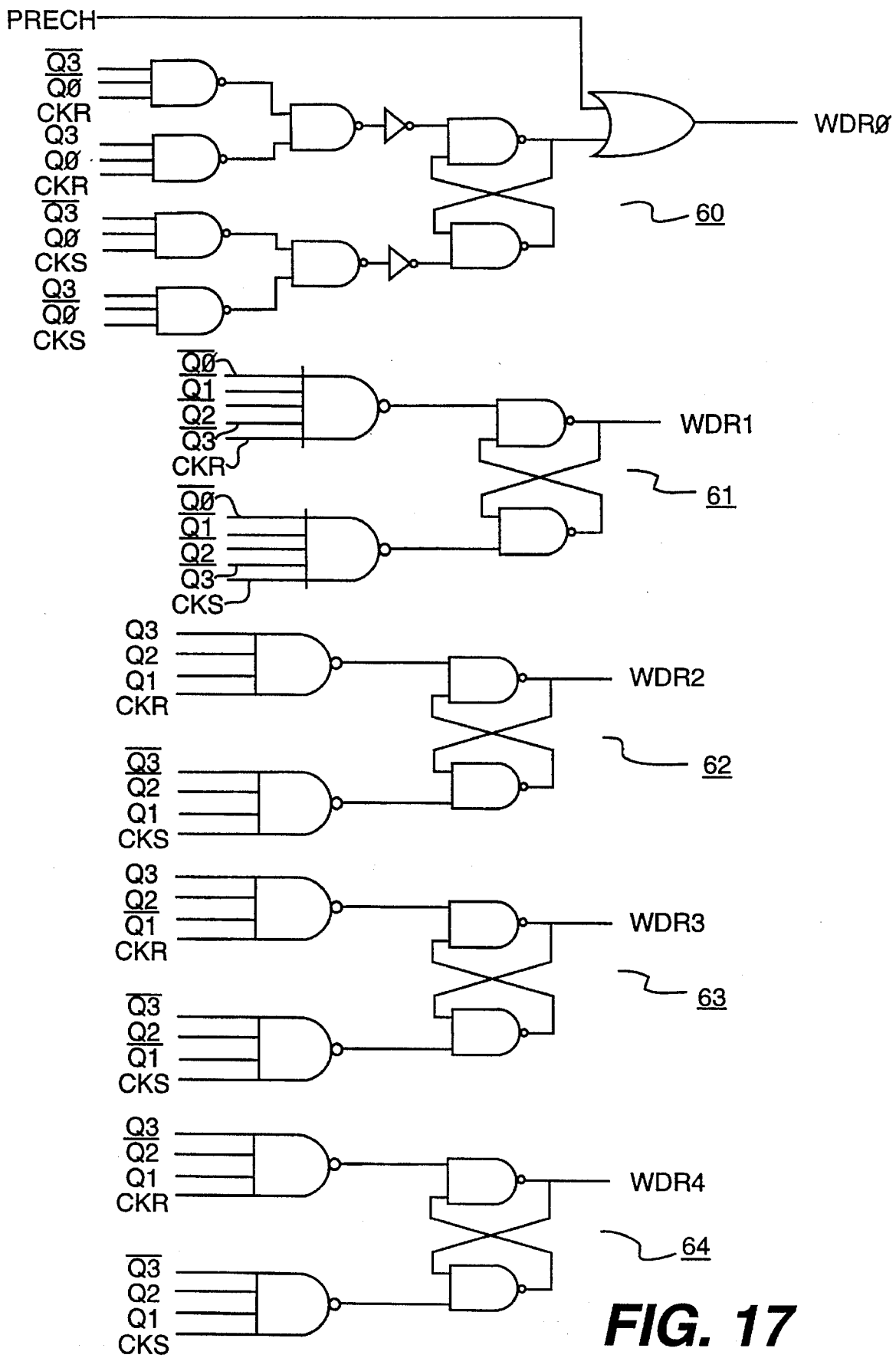
FIG. 17 is a flip-flop circuit diagram for explaining the row decoder circuit in FIG. 15.

Four bits of counter output Q0Q1Q2Q3 shown in FIG. 16 are increased on by one the timing of clock CK. One combination of counter output corresponds to one occurrence of sense amplifier operation, that is, one bit read out from the memory cell or one bit written to the memory cell.

For example, when clock CKS transitions to "H" when the counter circuit 80 output is Q3Q2Q1Q0=0000, WDR1, i.e., WL1L is raised to "H" and data of cell CA1 is read out. This operation is realized as output of flip-flop circuit 61 is raised to "H" by five signals CKS, \Q0,\Q1,\Q2 and \Q3 with "H" state.

Then, after the counter circuit 80 is increased to 0001, CKS is raised to "H" and WDR0, i.e., WL0 is raised to "H" and data of CA2 is read out.

Then, after counter circuit 80 output is increased to 0010, WL0 is lowered to "L" as CKR is raised to "H", because flip-flop circuit 60 output is lowered to "L" by three signals \Q3,\Q0 and CKR with "H" state.

Following to WL0's lowering to "L", WL1 is raised to "H" as CKS is raised to "H" as output of flip-flop circuit 62 is raised to "H", and then data of cell CA3 is read out.

In this manner, the waveforms shown in FIG. 6 can be obtained.

Figure 7:
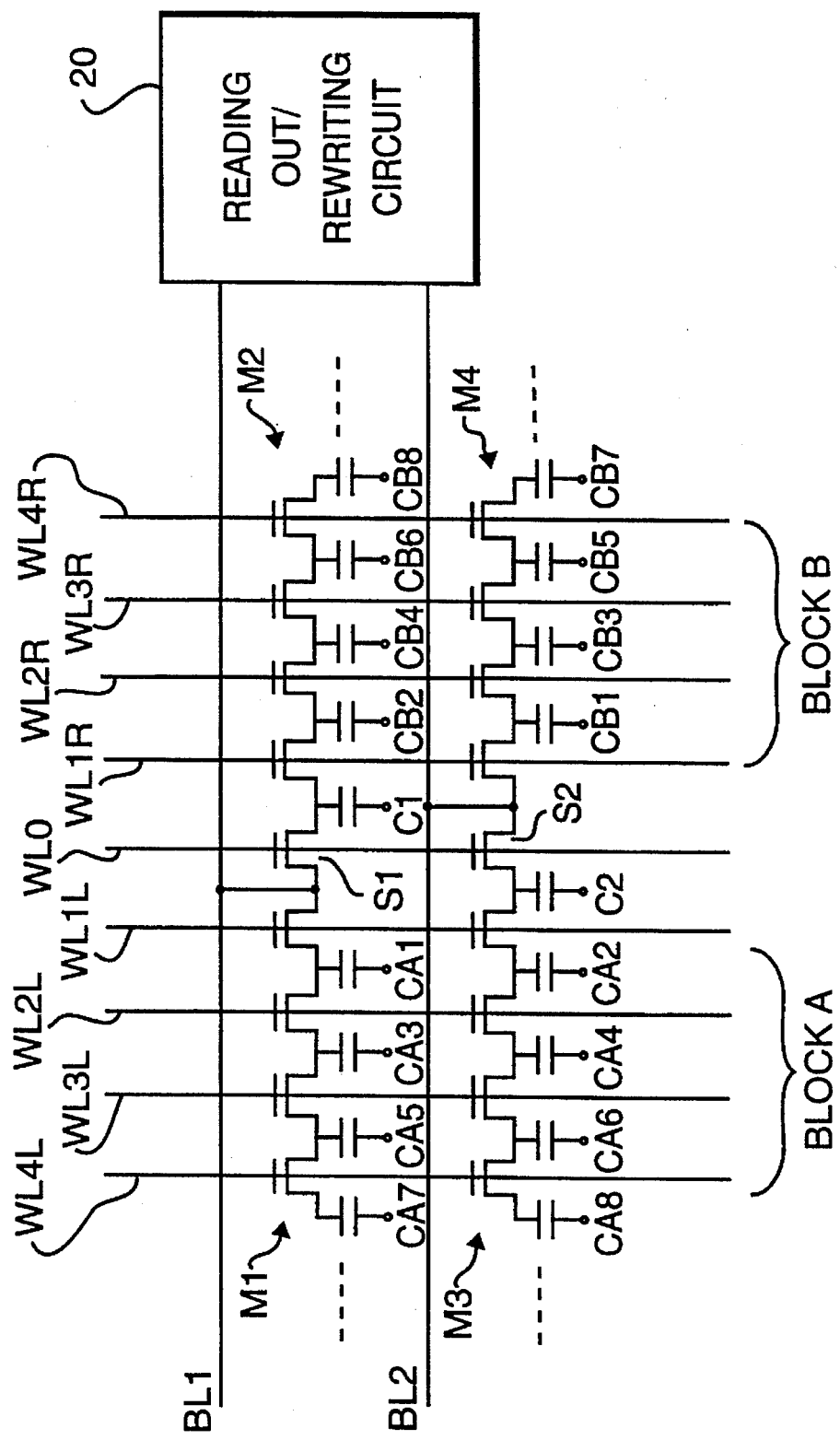
FIG. 7 is a circuit diagram showing a NAND type DRAM of a 3rd embodiment, according to the present invention.
Figure 8A:
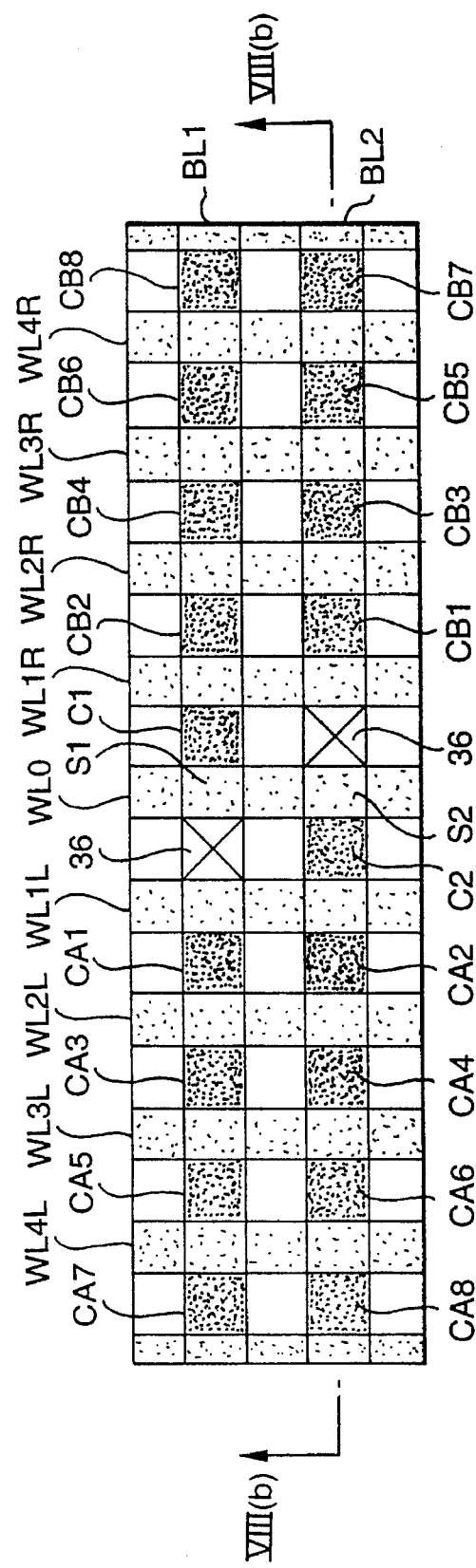
FIG. 8(a) and FIG. 8(b) are a plan view and a sectional view of the 3rd embodiment, according to the present invention, respectively.
Figure 8B:
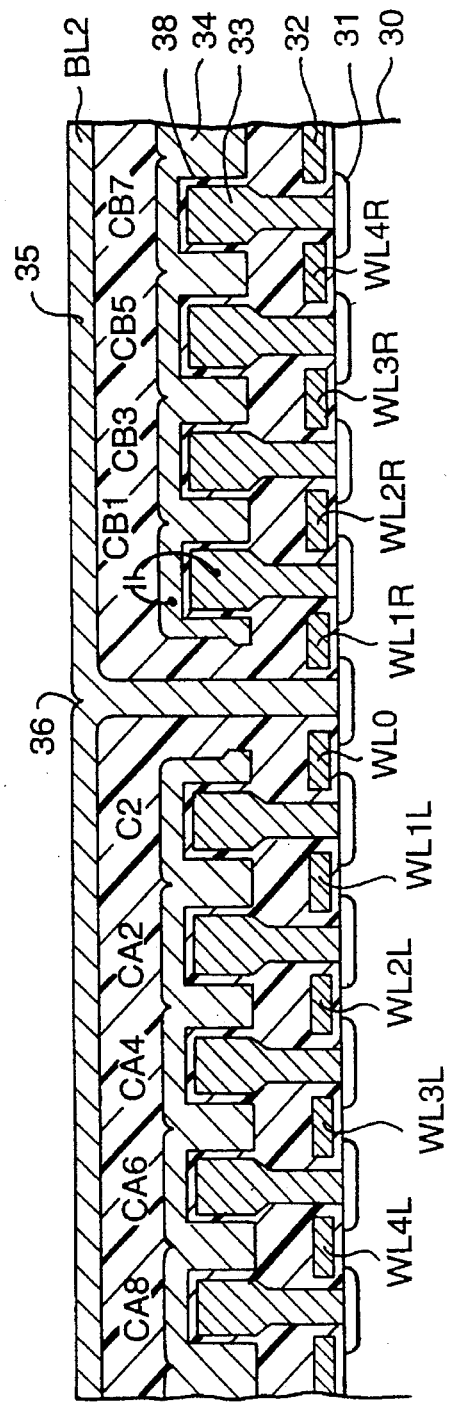

FIG. 7 shows a circuit diagram of a NAND type DRAM of a third embodiment of this invention. FIG. 8(a) is a plan view of a layout of the DRAM of the 3rd embodiment and FIG. 8(b) shows a sectional view of the DRAM in the direction of the arrow VIII(b)—VIII(b) in FIG. 8(a). Reference numerals which are the same as used in connection with the first embodiment identify the same elements in the third embodiment.

The fundamental construction of the third embodiment is the same as that of the second embodiment, as shown in FIG. 4. The third embodiment differs from the second embodiment in the following respects. Capacitor C1 is connected to the drain of the first selective gate transistor S1 and capacitor C2 is connected to the source of the second selective gate transistor S2.

Figure 9:
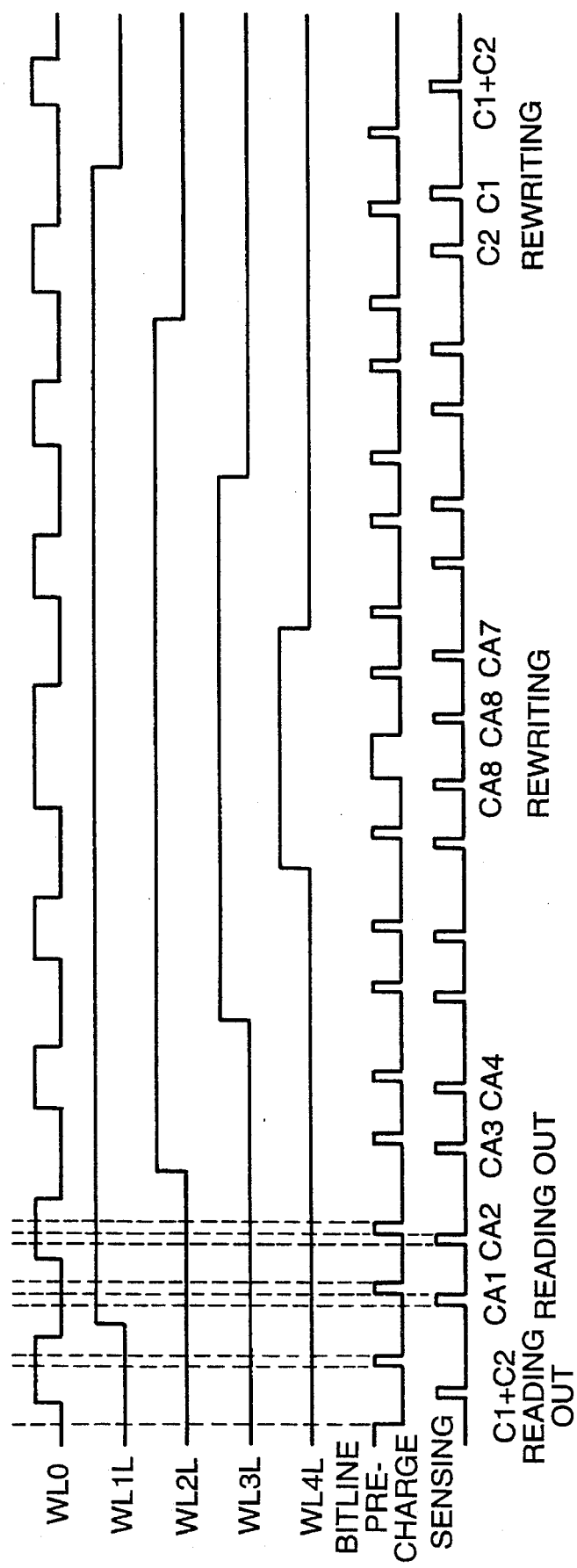
FIG. 9 is an operating waveform chart of the 3rd embodiment.

FIG. 9 shows an operating waveform chart for the circuit of the third embodiment and illustrates the case in which the date of memory cells in block A in FIG. 7 are accessed. The memory cell data in block B can be similarly accessed, so that only an explanation of access to block A Is provided. Since the read-out and the re-write of the cell data of CA1–CA8 are the same as that of the second embodiment, the explanation thereof is omitted. However, on explanation of the read-out and rewrite of capacitors C1 and C2 is provided.

The memory cell array of this embodiment has a structure in which the capacitor C1 is connected between two transistors respectively connected to WL0 and WL1R, in the NAND cell connected with BL1.

Moreover, this memory cell array has the structure in which the capacitor C2 is connected between two transistors respectively connected to WL0 and WL1L, in the NAND cell connected with BL2.

The store capacitors C1 and C2 are capacitors for DRAM cells which store data, so that when a common word line WL0 connected with the transfer gate transistors S1 and S2 is selected, each data of C1 and C2 is simultaneously transmitted to BL1 and BL2.

By treating these two capacitors C1 and C2 to be considered together as a single memory cell and using BL1 and BL2 for reading-out and writing of the data as complimentary bit-lines, one extra bit data can be stored.

Figure 10:
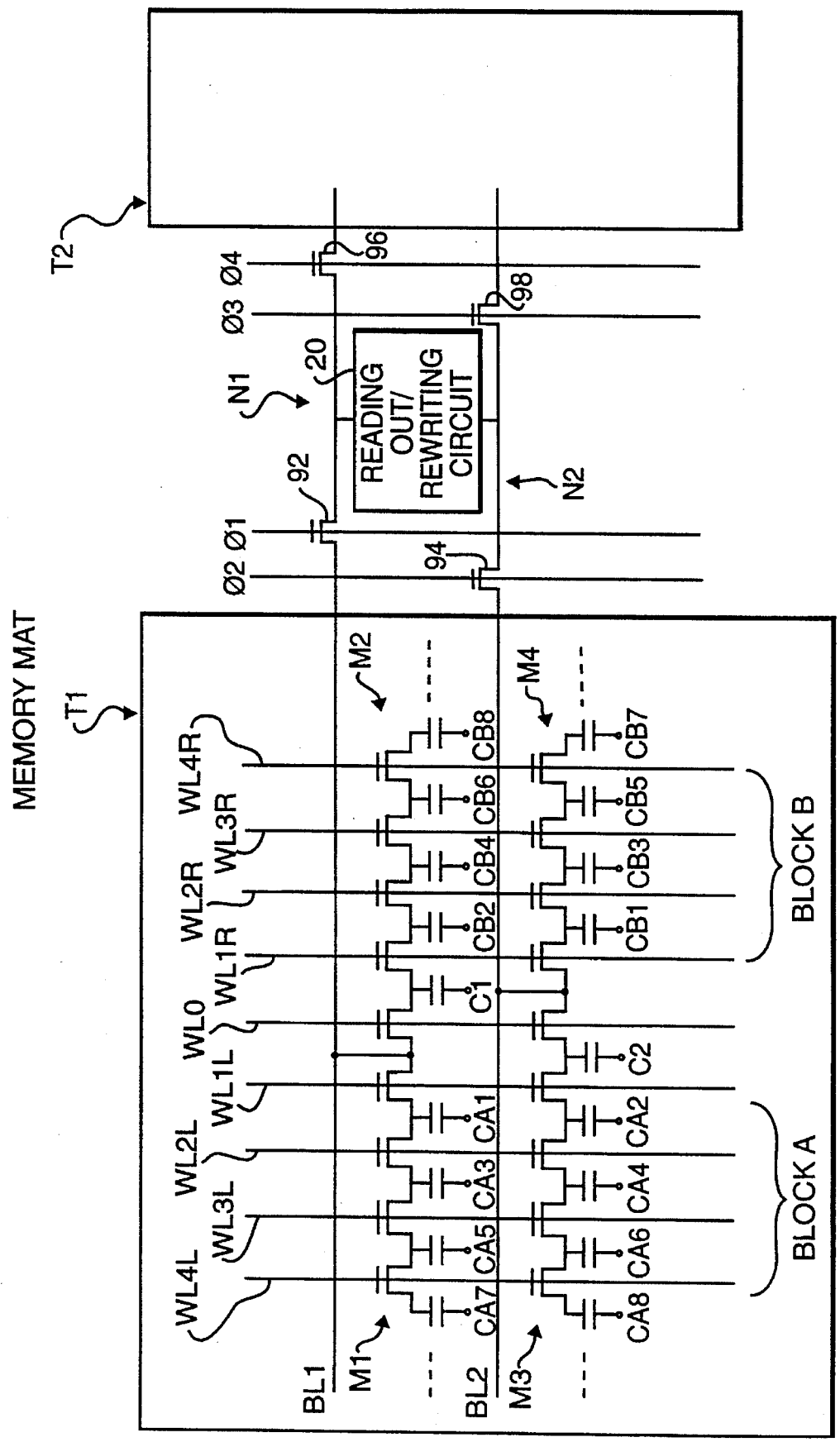
FIG. 10 is a circuit diagram showing a NAND type DRAM of a 4th embodiment, according to the present invention.

Consequently, a practical integration density can be further improved. FIG. 10 shows a circuit diagram of a NAND type DRAM of a fourth embodiment of this invention. In this embodiment, circuit 20 has two adjacent memory mats T1 and T2. The layout and structure of a memory cell in the fourth embodiment are substantially the same in the third embodiment as shown in FIG. 8. However, the capacitors C1 and C2 are treated as discrete memory elements and are not considered together. In this regard, transfer gate 92 and 94 are interposed in bit lines BL1 and BL2, respectively, between the memory cells in the memory mat T1 and the circuit 20. This is because independent data in cells C1 and C2 are simultaneously transmitted to BL1 and BL2, and they could not be used as reference bit lines of each other, and the nodes N1 and N2 in circuit 20 must not be connected to BL1 and BL2 at the same time for access to C1 and C2.

The transfer gates 96 and 98 are used as connection of reference bit lines in another memory mat T2 to circuit 20 as follows: when transfer gate 92 becomes conductive and BL1 is electrically connected to node N1 of circuit 20 for reading data of cell C1, the transfer gate 98 also becomes conductive and a bit line in another memory mat is electrically connected to node N2, as a reference bit line of BL1, and data of C1 is read out with an open bit line architecture. When data of C2 is read out through BL2 and transfer gate 94 to node N2, the transfer gate 96 becomes conductive and the reference bit line of BL2 in another memory mat is connected to node N1.

Figure 11:
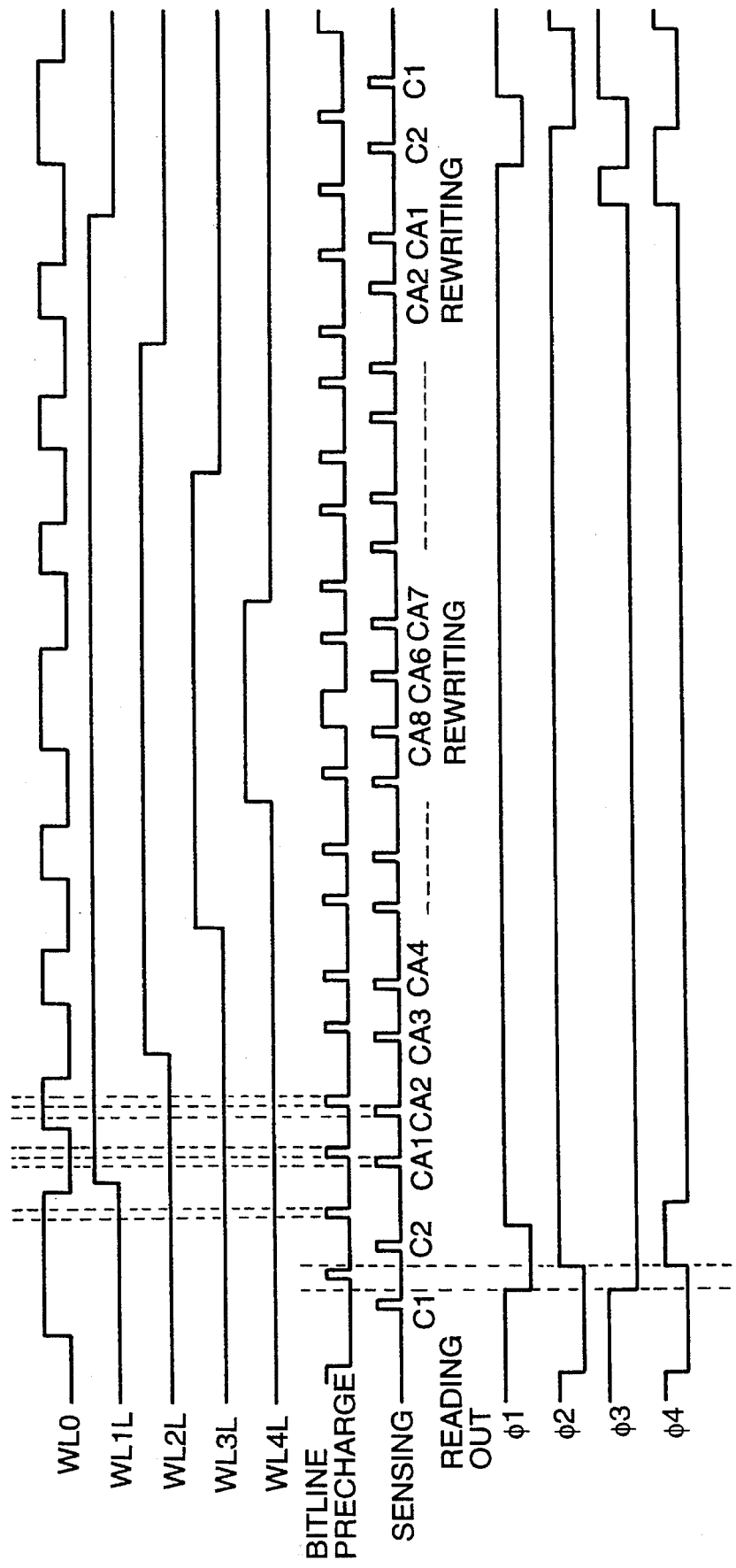
FIG. 11 is an operating waveform chart of the 4th embodiment.
Figure 12:
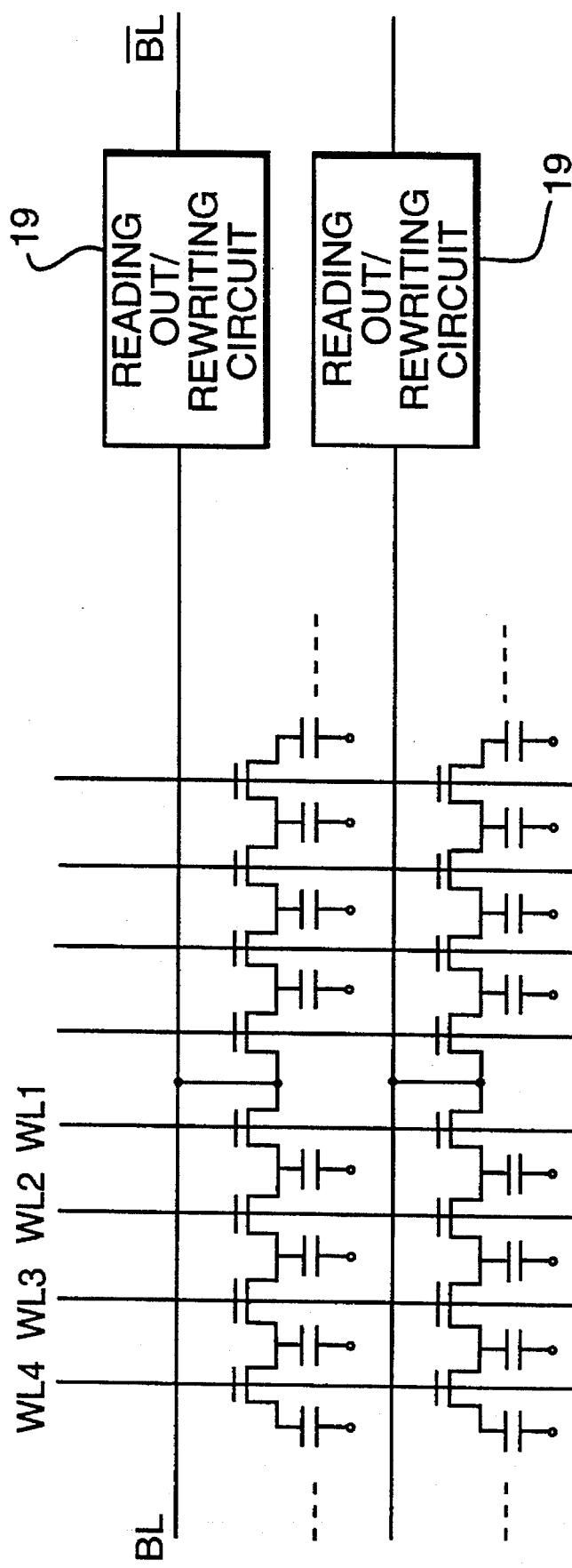
FIG. 12 is a circuit diagram showing a conventional NAND type DRAM.
Figure 14:
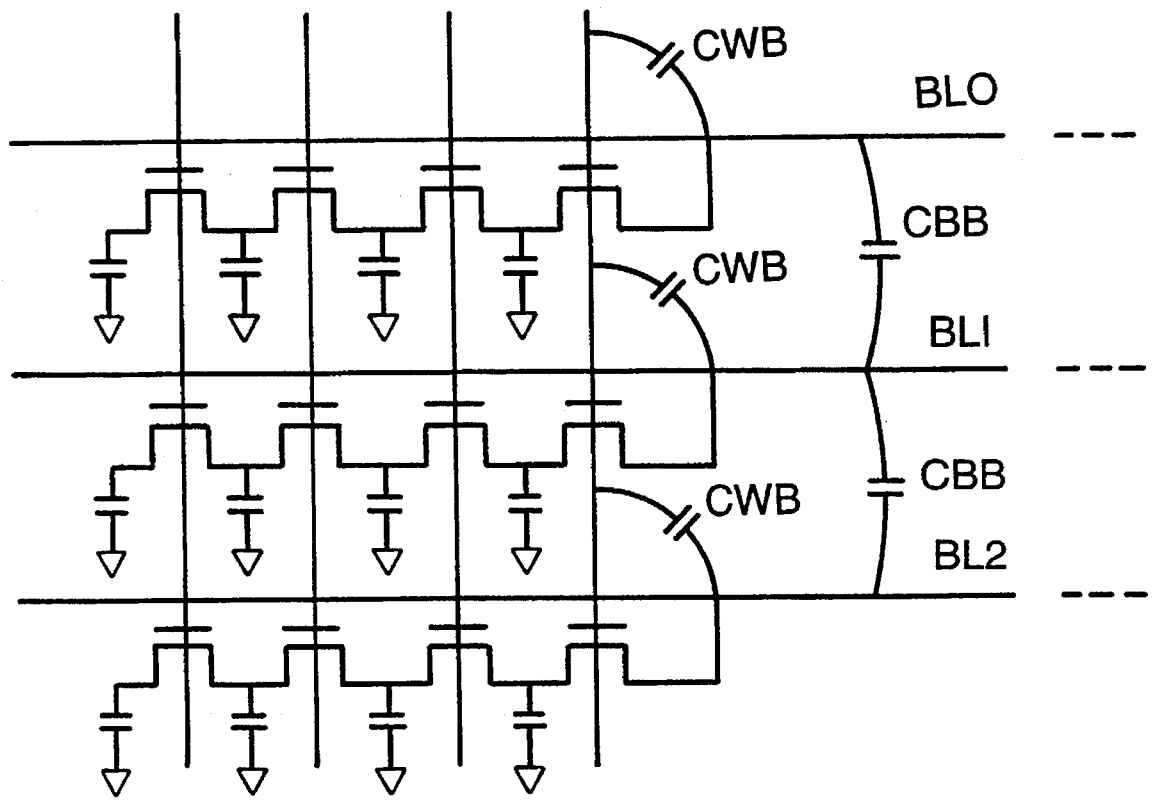
FIG. 14 is a circuit diagram for explaining a problem with the experienced with the conventional NAND type DRAM.

FIG. 11 shows an operating wave form chart for the circuit of the fourth embodiment and illustrates the case in which the data of memory cells in block A in FIG. 10 are accessed. The same wave form chart is applicable to the case of block B. The reading-out and re-writing of the cell data of CA1 to CA8 are the same as that of the second and the third embodiments. However, a method of reading-out or writing of the data of C1 and C2 differs from the third embodiment.

When reading and writing the cell data of C1 and C2, the capacitance of the corresponding bit line becomes low relative to the capacitance of four capacitors of memory cell, compared with the case in accessing the farthest cell from the bit line contact among a NAND type cell. Therefore, an open bit-line architecture is used for the access to the cell data of C1 and C2. In accessing the cell, for example, CA7, CA8, in which the capacitance of the bit line becomes larger, a folded bit-line architecture having a large noise resistance is used. Such folded bit-line architecture is used for the access to CA1 to CA8.

Data of NAND cells connected with a pair of bit lines are alternately read out applying a specific voltage to word lines connected to the NAND cells. The data are read only to one bit line and the folded bit-line architecture is practical.

In the fourth embodiment, each of the capacitors C1 and C2 is used as a memory cell of one bit. Consequently, a practical integration density can be improved, compared with the third embodiment.

Moreover, an integration density substantially the same as realized in the case in which all bit lines are accessed by using the open bit-line architecture is realizable.

The invention in its broader aspects is not limited to the specific details and illustrated examples shown and described. Accordingly, it is intended that the present invention cover such modifications and variations provided that they fall within the scope of the appended claims and their equivalents.

What is claimed is:

1. A dynamic random access memory, comprising:

a first and second memory cell group, each of the first and second groups including a plurality of memory cells electrically coupled in series, each of the memory cells comprising an insulated gate type MOS transistor and a capacitor coupled to the MOS transistor;

a first and a second bit line coupled to one end of the first and second memory cell groups, respectively;

a plurality of word lines each commonly coupled to the gates of corresponding ones of the MOS transistors of the first and second memory cell groups, respectively; and means for reading out from the first and second memory cell groups data from the memory cells of the first and second memory cell groups with the first and second bit lines each providing a voltage reference during reading of data from the memory cells of the second and first memory cell groups, respectively.

2. A dynamic semiconductor memory device including a plurality of memory cell units, each unit having a plurality of insulated gate type transistors coupled in series and a plurality of capacitors for storing data, each of the capacitor coupled to one of the transistors, respectively, the memory device comprising:

a plurality of bit lines, each bit line coupled to a first one of the transistors at one end of the series coupled transistors of one of the memory cell units, respectively, and paired with another one of the plurality of bit lines;

a pair of first word lines respectively coupled the gates of the first transistors of the memory cell units connected to the paired bit lines; and second word lines each coupled to the gates of corresponding ones of the transistors of the memory cell units connected to the paired bit lines.

3. A dynamic semiconductor memory device according to claim 2, further comprising:

a first voltage applying means, coupled to the pair of first words lines, for alternately applying a first predetermined voltage to the pair of first word lines; and a second voltage applying means coupled to the second word lines for applying a second predetermined voltage to the second word lines in a predetermined sequence.

4. A dynamic semiconductor memory device according to claim 3, further comprising:

a reading out/rewriting circuit, coupled to the paired bit lines, for reading out and rewriting data from/to the memory cell units.

5. The dynamic semiconductor memory device according to claim 4, wherein the second voltage applying means includes means for withholding application of the second predetermined voltage to the second word lines to enable reading of the data of the capacitors coupled to the first transistors in the cell units respectively associated with the paired bit lines in response to application of the first predetermined voltage; and wherein the second voltage applying means includes means for applying the second predetermined voltage in the predetermined sequence such that the capacitors coupled to the paired bit lines through ones of the transistors other than the first transistor of each cell unit can be read in accordance with the predetermined sequence.

6. The dynamic semiconductor memory device according to claim 5, wherein the means for applying the second predetermined voltage includes means for applying the second predetermined voltage to ones of the transistors other than the first transistor of each cell unit to alternately read the capacitors of the memory cell units coupled to the paired bit lines in a sequence beginning with the capacitor coupled to the transistor closest to the first transistor in each cell unit.

7. The dynamic semiconductor memory device according to claim 5, wherein the means for applying the second predetermined voltage includes means for applying the second predetermined voltage to ones of the transistors other than the first transistor of each cell unit to read two adjacent capacitors of one of the memory cell units coupled to the paired bit lines and then to read two adjacent capacitors of the other one of the memory cell units coupled to the paired bit lines.

8. A dynamic semiconductor memory device including first, second, third, and fourth memory cell units each having insulated gate type transistors coupled in series and capacitors for storing data, each of the capacitors coupled to one of the transistors, respectively, the memory device comprising:

a first bit line coupled to a first transistor at one end of the series coupled transistors of the first and second memory cell units, respectively, and a second bit line coupled to a first transistor at one end of the series coupled transistors of the third and fourth memory cell units, respectively;

first word lines each coupled to the respective gates of corresponding ones of the transistors of the first and third cell units for selecting specified capacitors, and second word lines each coupled to the respective gates of corresponding ones of the transistors of the second and fourth cell units for selecting specified capacitors;

a first transfer gate transistor having first and second terminals respectively coupled to the first transistors of the first and second memory cell units, the first terminal of the first transfer gate transistor also coupled to the first bit line; and a second transfer gate transistor having first and second terminals respectively coupled to the first transistors of the third and fourth memory cell units, the second terminal of the second transfer gate transistor also coupled to the second bit line.

9. A dynamic semiconductor memory device according to claim 8, further including first and second capacitors respectively coupled to said first and second transfer gate transistors, said first and second capacitors comprising at least one memory cell.

10. The dynamic semiconductor memory device according to claim 9, wherein the first and second capacitors comprise only one memory cell.

11. A dynamic semiconductor memory device according to claim 8, further comprising:

a third word line coupled to the first and second transfer gate transistors;

a first voltage applying means for applying a first predetermined voltage to the third word line to turn the first and second transfer gate transistors on and off with a first predetermined timing;

a second voltage applying means for applying a second predetermined voltage to the first and second word lines; and a reading out/rewriting circuit connected to the first and second bit lines;

wherein data in capacitors of the first memory cell unit are read out to the circuit while the first and second transfer gate transistors are turned on, data in capacitors of the third memory cell unit being read out to the circuit while the first and second transfer gate transistors are turned off.

12. A dynamic semiconductor memory device according to claim 11, wherein the first voltage applying means applies the first predetermined voltage to the third word line to simultaneously read out data stored in the first and second capacitors prior to reading data stored in capacitors of the first and second memory sell units.

13. A dynamic semiconductor memory device according to claim 11, further comprising:

means for connecting and disconnecting the bit lines and the reading out/rewriting circuit.

* * * * *